(12) United States Patent
Lee et al.

(10) Patent No.: US 9,768,112 B2
(45) Date of Patent: *Sep. 19, 2017

(54) SEMICONDUCTOR DEVICE AND METHOD FABRICATING THE SAME

(71) Applicant: Taiwan Semiconductor Manufacturing Company Limited, Hsinchu (TW)

(72) Inventors: Hsiao-Chun Lee, Hsinchu (TW); Chi-Feng Huang, Hsinchu (TW); Victor Chiang Liang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/198,338

(22) Filed: Jun. 30, 2016

(65) Prior Publication Data

US 2016/0307841 A1  Oct. 20, 2016

Related U.S. Application Data

(63) Continuation of application No. 14/279,446, filed on May 16, 2014, now Pat. No. 9,406,626.

(51) Int. Cl.
| | |
|---|---|
| H01L 23/522 | (2006.01) |
| H01L 23/58 | (2006.01) |
| H01L 23/00 | (2006.01) |
| H01L 49/02 | (2006.01) |
| H01L 23/66 | (2006.01) |

(52) U.S. Cl.
CPC ...... *H01L 23/5225* (2013.01); *H01L 23/5223* (2013.01); *H01L 23/5227* (2013.01); *H01L 23/564* (2013.01); *H01L 23/585* (2013.01); *H01L 23/66* (2013.01); *H01L 28/10* (2013.01); *H01L 28/20* (2013.01); *H01L 28/40* (2013.01); *H01L 23/562* (2013.01); *H01L 2223/6627* (2013.01); *H01L 2223/6672* (2013.01); *H01L 2924/0002* (2013.01)

(58) Field of Classification Search
CPC combination set(s) only.
See application file for complete search history.

(56) References Cited

U.S. PATENT DOCUMENTS

| | | | |
|---|---|---|---|
| 7,265,438 | B2 | 9/2007 | Tsai et al. |
| 7,893,459 | B2 | 2/2011 | Wang et al. |
| 7,898,056 | B1 | 3/2011 | Keramat et al. |
| 8,242,586 | B2 | 8/2012 | Chang et al. |
| 2004/0212039 | A1 | 10/2004 | Yamamoto |
| 2006/0214798 | A1 | 9/2006 | Wang |
| 2012/0313217 | A1* | 12/2012 | Hung ............ H01L 23/585 257/532 |

* cited by examiner

*Primary Examiner* — Mamadou Diallo
(74) *Attorney, Agent, or Firm* — Jones Day

(57) ABSTRACT

According to an exemplary embodiment, a semiconductor device is provided. The semiconductor device includes a first seal ring and a first circuit. The first circuit includes a first capacitor and a first inductor connected in series. The first circuit is connected between the first seal ring and a ground.

20 Claims, 11 Drawing Sheets

310

320

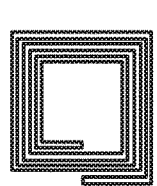 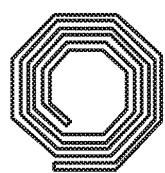 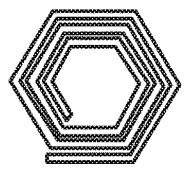 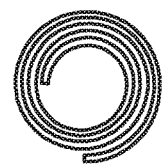
Fig.8A    Fig.8B    Fig.8C    Fig.8D
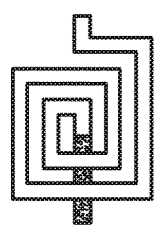 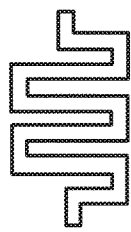 
Fig.8E    Fig.8F    Fig.8G

910

920

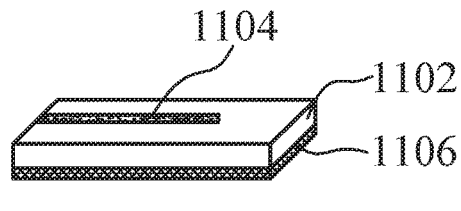
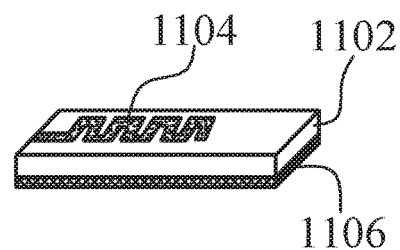
Fig.11A    Fig.11B
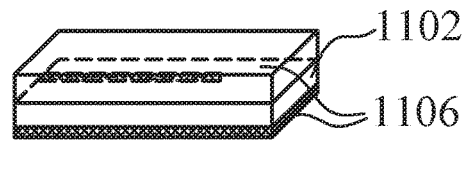
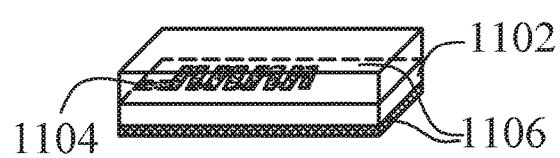
Fig.11C    Fig.11D
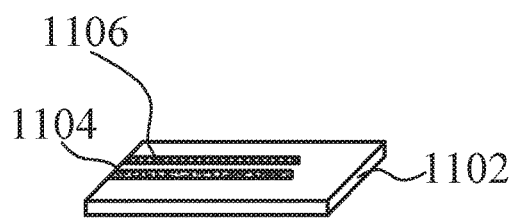
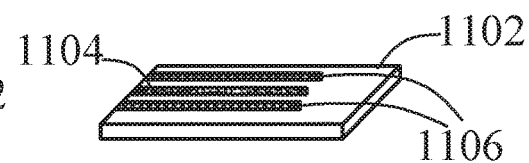
Fig.11E    Fig.11F
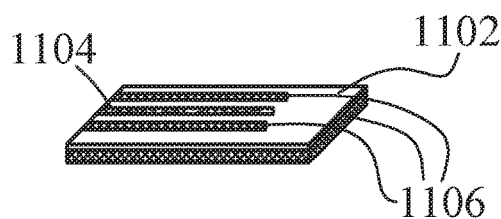
Fig.11G

SEMICONDUCTOR DEVICE AND METHOD FABRICATING THE SAME

This is a continuation of U.S. application Ser. No. 14/279,446, filed May 16, 2014, hereby incorporated herein by reference.

BACKGROUND

This invention relates to integrated circuits, and more specifically to integrated circuits with seal ring structures.

Modern IC technology may include digital blocks, and analog/RF blocks in a single semiconductor device. The analog/RF block is more sensitive to and is easily interfered by the noise that generated by other blocks and coupled via the seal ring. Therefore, there is a need to enhance the noise immunity of the noise-sensitive blocks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8G are exemplar inductors in accordance with some embodiments.

FIGS. 11A-11G are exemplar first circuits of the semiconductor device in accordance with some embodiments.

DETAILED DESCRIPTION

Figure 1:
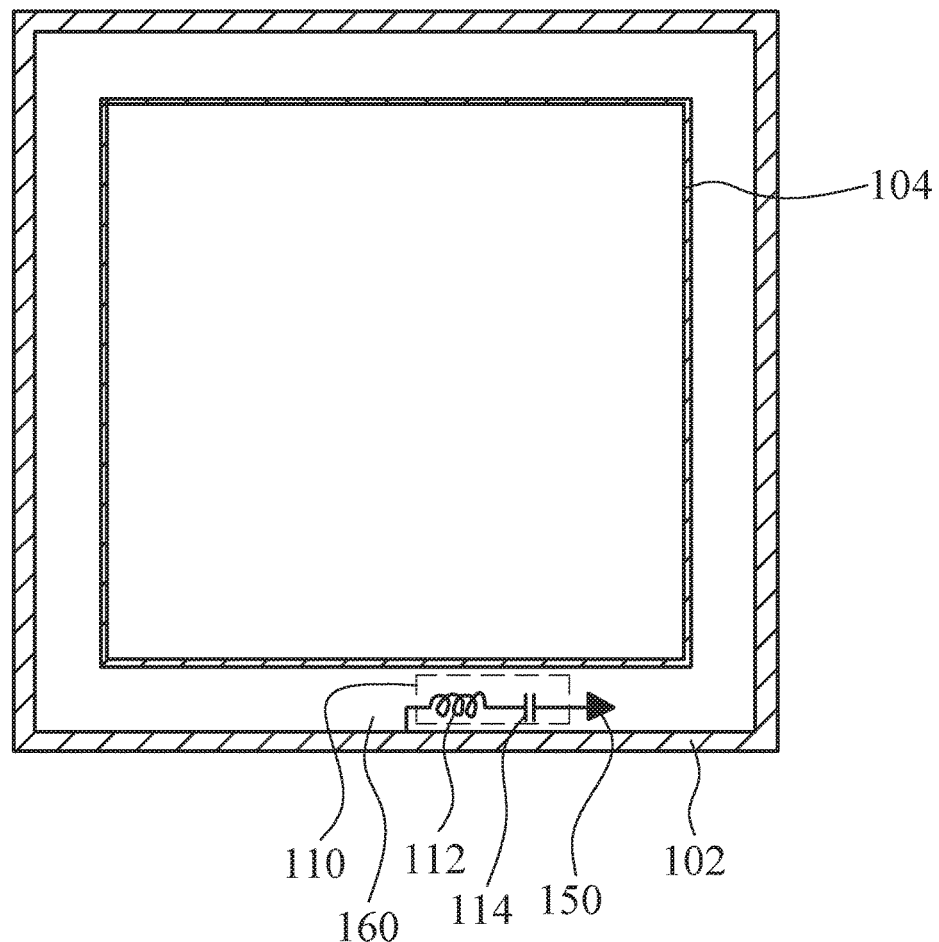
FIG. 1 is a top view illustrating an exemplar semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a semiconductor device that has a seal ring and a series inductor and capacitor connected between the seal ring and the ground. Based on the experimental result, this disclosure provides better noise immunity at specific frequency band compared with the typical seal ring or the segmental seal ring. When the semiconductor device has an inner seal ring and an outer seal ring, connecting the series inductor and capacitor to the inner one provides better noise immunity and isolation bandwidth. Additionally, the disclosure does not limit the number of sets of series inductor and capacitor. Using more than one set of series inductor and capacitor instead of a single one may further improve noise immunity and isolation bandwidth.

Moreover, placing the series inductor and capacitor near the noise-sensitive component may provide the same benefit as well. Furthermore, the scope of the disclosure includes the semiconductor device having a resistor and the resistor's connection to the series inductor and capacitor.

FIG. 1 is a top view illustrating an exemplar semiconductor device in accordance with some embodiments. As shown in FIG. 1, a semiconductor device 100 is provided. The semiconductor device 100 includes a first seal ring 102, a main circuit 104, and a first circuit 110. The main circuit 104 is disposed inside the first seal ring 102. The main circuit 104 may include any digital circuit or analog/RF circuit. The first circuit 110 is connected between the first seal ring 102 and a ground 150. The ground 150 may be an AC ground. The first circuit 110 includes a first capacitor 114 and a first inductor 112 connected in series. Based on the experimental result, this disclosure provides better noise immunity at specific frequency band (such as 1 GHz-10 GHz) compared with the typical seal ring or the segmental seal ring.

In the embodiment, the first circuit 110 is disposed in an assembly isolation region 160 of the semiconductor device 100. Less area overhead may occur by placing the first inductor 112 and the first capacitor 114 within assembly isolation region 160. Additionally, the quality factor of the first circuit 110 is about 1.5 to 10.

Figure 2:
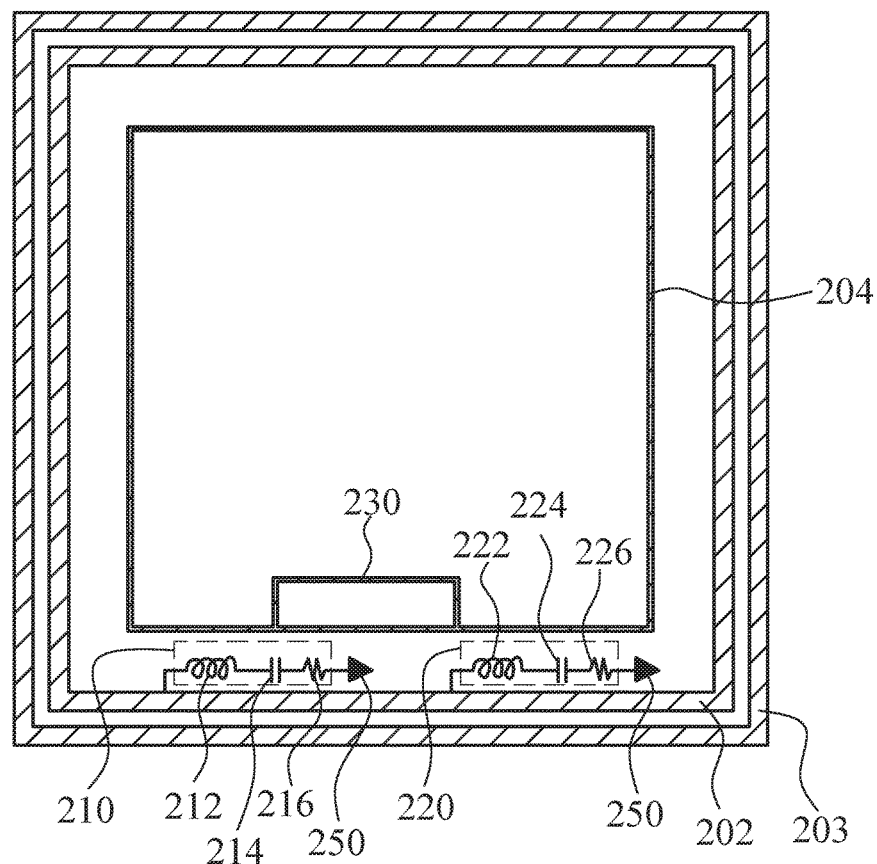
FIG. 2 is a top view illustrating an exemplar semiconductor device in accordance with some embodiments.

FIG. 2 is a top view illustrating an exemplar semiconductor device in accordance with some embodiments. As shown in FIG. 2, a semiconductor device 200 is provided. The semiconductor device 200 includes a first seal ring 202, a second seal ring 203, a main circuit 204, a first circuit 210, and a second circuit 220. The main circuit 204 is disposed inside the first seal ring 202. The main circuit 204 may refer to any digital circuit or analog/RF circuit.

The second seal ring 203 is disposed outside the first seal ring 202. The first seal ring 202 may refer to an inner seal ring, and the second seal ring 203 may refer to an outer seal ring. The first circuit 210 and the second circuit 220 are connected between the first seal ring 202 and a ground 250 in parallel. The ground 250 may be an AC ground. The first circuit 210 includes a first resistor 216, a first capacitor 214 and a first inductor 212 connected in series. The second circuit 220 includes a second resistor 226, a second capacitor 224 and a second inductor 222 connected in series. Based on the experimental result, this disclosure using both of the first circuit 210 and the second circuit 220 provides better noise immunity at specific frequency band (such as about 1 GHz-15 GHz) compared to that using a single set of series inductor and capacitor.

In the embodiment, the main circuit 204 includes a noise-sensitive component 230. Placing the first circuit 210 and the second circuit 220 near the noise-sensitive component 230 of the main circuit 204 may further improve noise immunity. In the embodiment, the semiconductor device 200 has the first seal ring 202 (inner seal ring) and the second seal ring 203 (outer seal ring). Connecting the first circuit 210 and the second circuit 220 to the inner seal ring 202 provides better noise immunity and isolation bandwidth. In the embodiment, the first seal ring 202 and the second seal ring 203 are both continuous and not segmental.

Figure 3A:
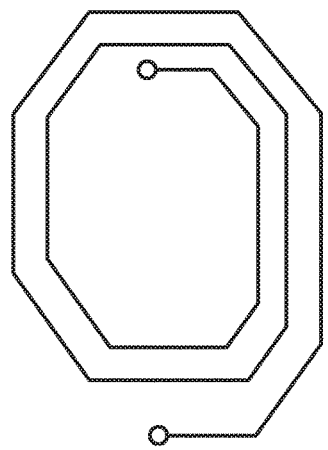
FIGS. 3A and 3B are top views illustrating exemplar inductors in the semiconductor device in accordance with some embodiments.
Figure 3B:

FIGS. 3A and 3B are top views illustrating exemplar inductors in the semiconductor device in accordance with some embodiments. As shown in FIG. 3A, a spiral inductor 310 which may be used in the semiconductor device is provided. As shown in FIG. 3B, a meander inductor 320 which may be used in the semiconductor device is provided. The inductor used in the semiconductor device is not limited to any specific type and may be at least one of the spiral inductor, the meander inductor and the helical inductor.

Figure 4:
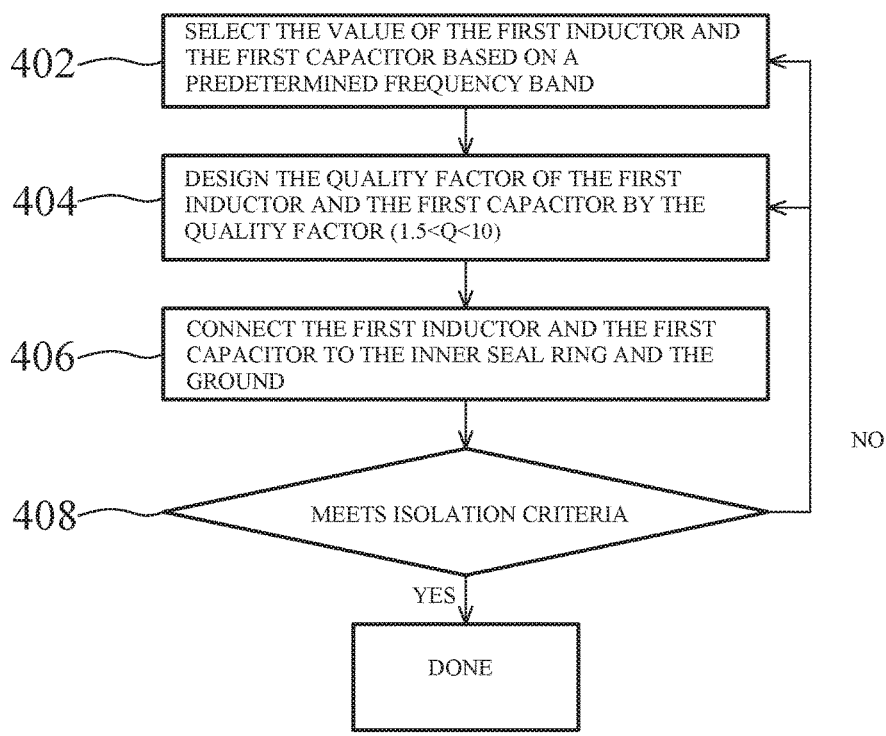
FIG. 4 is a flow chart for providing a semiconductor device in accordance with some embodiments.

FIG. 4 is a flow chart for providing a semiconductor device in accordance with some embodiments. As shown in FIG. 4, a method 400 is provided. The method includes the followings procedures: selecting the value of the first inductor and the first capacitor based on a predetermined frequency band (402); designing the quality factor of the first inductor and the first capacitor by the quality factor (such as 1.5-10) of the first circuit (404); connecting the first inductor and the first capacitor to the inner seal ring and the ground; determining whether the semiconductor device meets isolation criteria (408). If so, the method 400 ends; if not, the method 400 goes back to the procedures 402 or 404.

Figure 5:
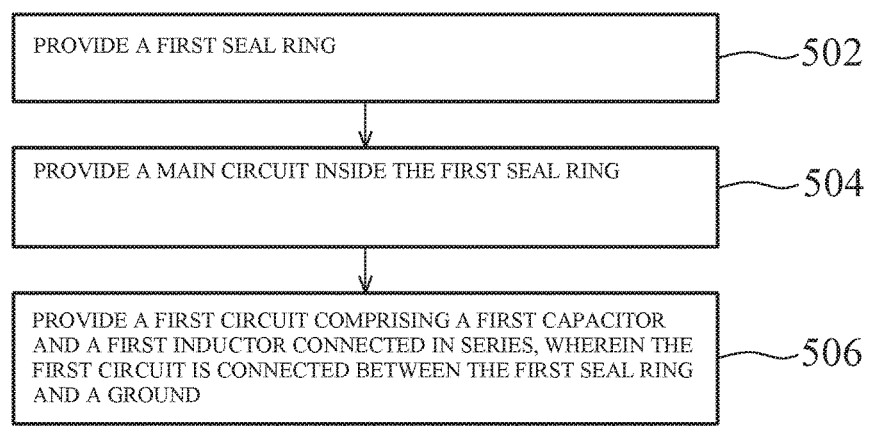
FIG. 5 is a flow chart for fabricating a semiconductor device in accordance with some embodiments.

FIG. 5 is a flow chart for fabricating a semiconductor device in accordance with some embodiments. As shown in FIG. 5, a method 500 is provided. The method 500 includes the following operations: providing a first seal ring (502); providing a main circuit inside the first seal ring (504); and providing a first circuit comprising a first capacitor and a first inductor connected in series, wherein the first circuit is connected between the first seal ring and a ground (506).

Figure 6A:
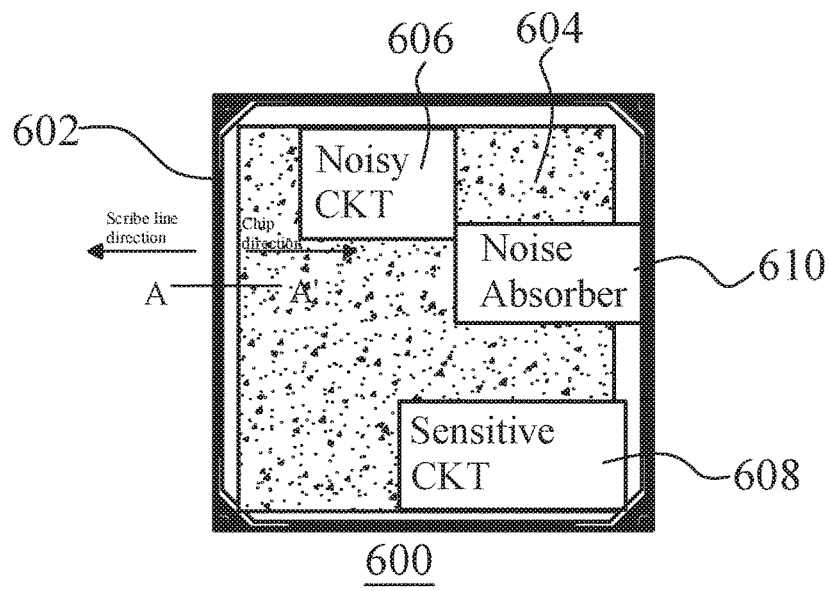
FIG. 6A is a top view illustrating an exemplar semiconductor device in accordance with some embodiments.
Figure 6B:
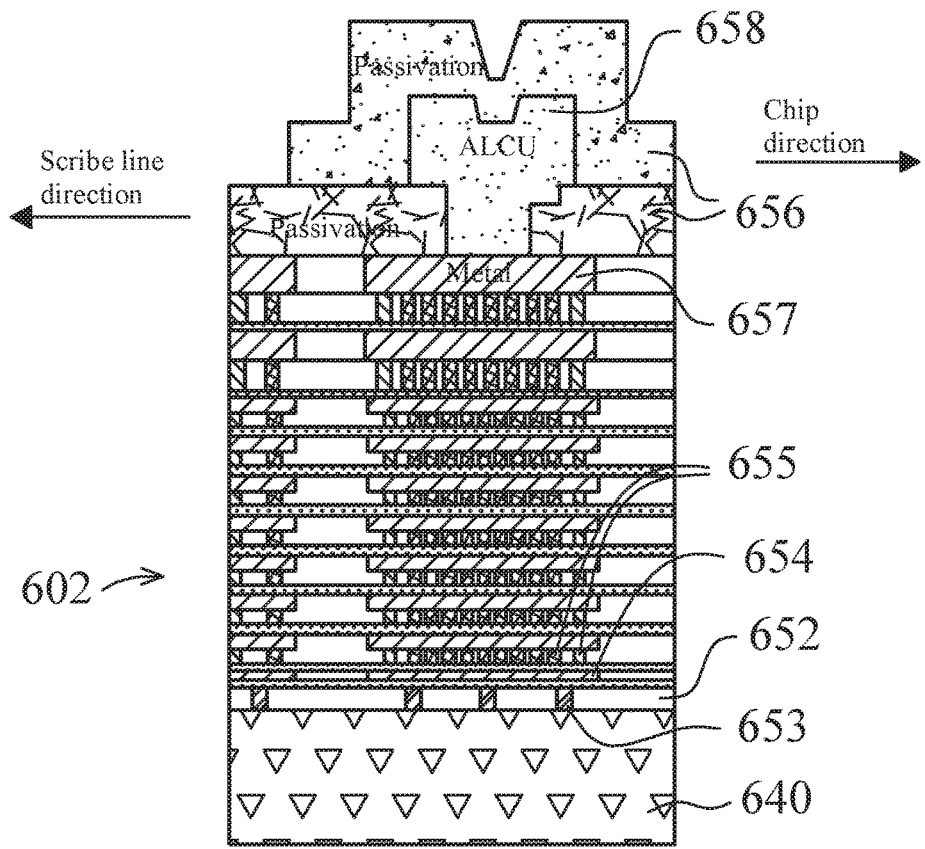
FIG. 6B is a cross sectional view illustrating an exemplar semiconductor device in accordance with some embodiments.

FIG. 6A is a top view illustrating an exemplar semiconductor device in accordance with some embodiments. FIG. 6B is a cross sectional view illustrating an exemplar semiconductor device in accordance with some embodiments. A semiconductor device 600 includes a first seal ring 602, a main circuit 604, and a noise absorber 610. The main circuit 604 includes a noisy circuit 606 and a sensitive circuit 608. The noise absorber 610 is connected to the seal ring 602. The noise absorber 610 decreases noise from the noisy circuit 606 so the noise does not be coupled to the sensitive circuit 608. The noise absorber 610 can be implemented by (1) series inductor and capacitor or (2) transmission line resonator.

The semiconductor device 600 may be manufactured with the following processes. A cross sectional view 650 between A and A' is taken as an example to describe the process of forming the semiconductor device 600, because the formation of the first seal ring 602, the main circuit 604, and the noise absorber 610 therein are integrated.

A substrate 640 is provided. A dielectric layer 652 is provided over the substrate 640 and is etched to form recesses for a contact 653. A metal layer 654 may connect the substrate 640 through the contact 653. The substrate 640 may be doped by P+ and P well for better electrically connection.

The seal ring 602 may be formed by repeatedly piling the metal layer 654, vias 655 on top of each other. Between the metal layers there are dielectric layer for isolation. Passivation layers 656 are covered above a top metal 657 for protection. A AlCu layer 658 is exposed for further connection when the portion of the passivation layers 656 over the AlCu layer 658 is removed. The seal ring 602 continuously surrounds the main circuit 604 to reduce stress cracks by die saw and prevent moisture penetration or chemical damage.

Figure 7:
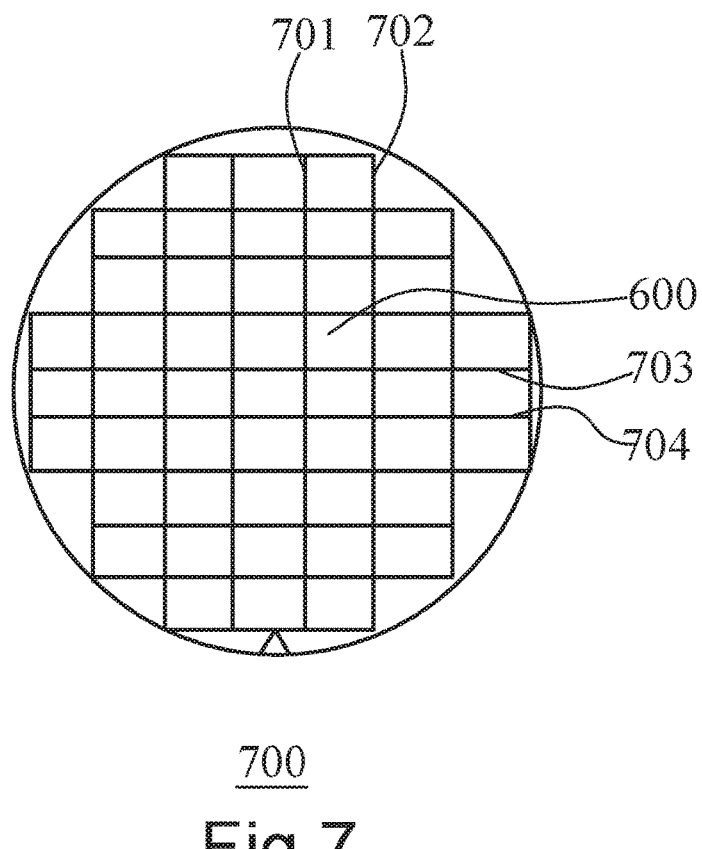
FIG. 7 is a block diagram illustrating a wafer including semiconductor devices in accordance with some embodiments.

FIG. 7 is a block diagram illustrating a wafer including semiconductor devices in accordance with some embodiments. As shown in FIG. 7, a wafer 700 is provided. The wafer 700 has a plurality of chips separated by a plurality of scribe lines. For example, the semiconductor device 600 is separated with other chips by scribe lines 701-704. The packaging process after die-sawed will be conducted by conventional package process, which will not detailed described here.

FIGS. 8A-8G are exemplar inductors in accordance with some embodiments. Inductors may be configured as spiral inductors with different shapes in FIGS. 8A-8E, meander inductors in FIG. 8F, or line inductors with single layer or multiple layer in FIG. 8G.

Figure 9A:
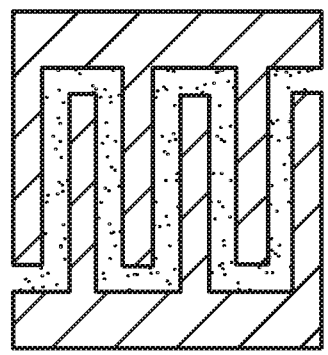
FIGS. 9A-9B are exemplar capacitors in accordance with some embodiments.
Figure 9B:
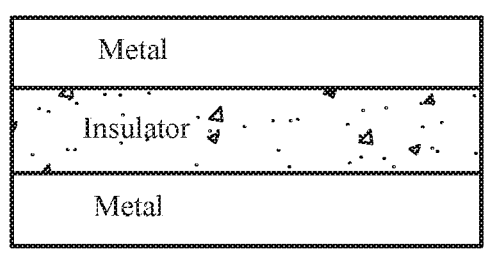

FIGS. 9A-9B are exemplar capacitors in accordance with some embodiments. Capacitors may be configured as metal-oxide-metal (MOM) capacitors 910 in FIG. 9A or metal-insulator-metal (MIM) capacitors 920 in FIG. 9B. The MOM capacitor 910 may be a multi-finger capacitor formed by multiple metal layers in the vertical BEOL (back-end-of-line) stack separated by inter-metal dielectrics. The MIM capacitor 920 may be a parallel-plate capacitor formed by two planes of metal separated by a thin high-K dielectric.

Figure 10A:
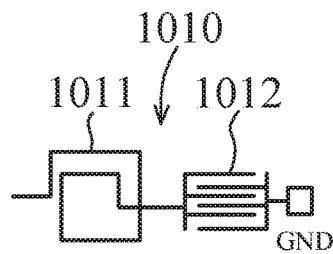
FIGS. 10A-10H are exemplar first circuits in accordance with some embodiments.
Figure 10B:
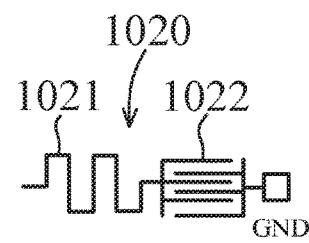

FIGS. 10A-10H are exemplar first circuits in accordance with some embodiments. FIGS. 10A-10F show top views of the first circuits. The first circuit may refer to a noise absorber to deal with noise generated by some noisy circuits through a seal ring. As shown in FIG. 10A, the first circuit 1010 includes a spiral inductor 1011 and a MOM capacitor 1012. One end of the inductor 1011 is connected to the seal ring (not shown); one end of the MOM capacitor 1012 is connected to ground (GND). As shown in FIG. 10B, the first circuit 1020 includes a meander inductor 1021 and a MOM capacitor 1022. One end of the inductor 1021 is connected to the seal ring (not shown); one end of the MOM capacitor 1022 is connected to ground (GND).

Figure 10C:
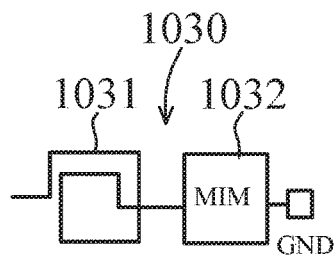
Figure 10D:
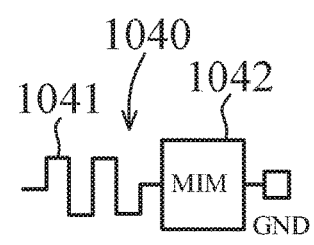

As shown in FIG. 10C, the first circuit 1030 includes a spiral inductor 1031 and a MIM capacitor 1032. One end of the inductor 1031 is connected to the seal ring (not shown); one end of the MIM capacitor 1032 is connected to ground (GND). As shown in FIG. 10D, the first circuit 1040 includes a meander inductor 1041 and a MIM capacitor 1042. One end of the inductor 1041 is connected to the seal ring (not shown); one end of the MIM capacitor 1042 is connected to ground (GND).

Figure 10E:
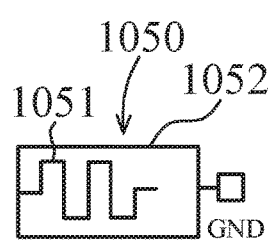
Figure 10F:
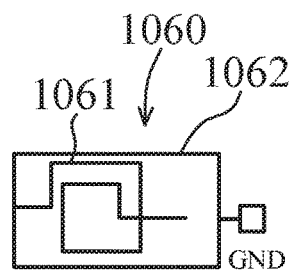

As shown in FIG. 10E, the first circuit 1050 includes a meander inductor 1051 and a MIM capacitor 1052. One end of the inductor 1051 is connected to the seal ring (not shown); one end of the MIM capacitor 1052 is connected to ground (GND). In the embodiment, a portion of the inductor 1051 is used as a plate of the MIM capacitor 1052. As shown in FIG. 10F, the first circuit 1060 includes a spiral inductor 1061 and a MIM capacitor 1062. One end of the inductor 1061 is connected to the seal ring (not shown); one end of the MIM capacitor 1062 is connected to ground (GND). In the embodiment, a portion of the inductor 1061 is used as a plate of the MIM capacitor 1062.

Figure 10G:
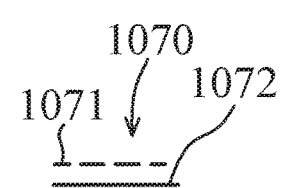
Figure 10H:
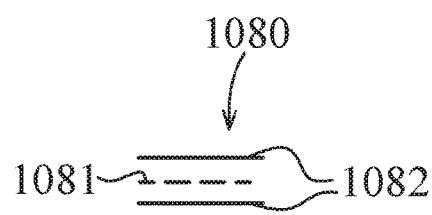

FIGS. 10G-10H show cross section views of the first circuits. As shown in FIG. 10G, the first circuit 1070 includes a meander inductor 1071 and a MIM capacitor 1072. One end of the inductor 1071 is connected to the seal ring (not shown); one end of the MIM capacitor 1072 is connected to ground (not shown). In the embodiment, a portion of the inductor 1071 is used as a plate of the MIM capacitor 1072. As shown in FIG. 10H, the first circuit 1080 includes a meander inductor 1081 and a MIM capacitor 1082. One end of the inductor 1081 is connected to the seal ring (not shown); one end of the MIM capacitor 1082 is connected to ground (not shown). In the embodiment, a portion of the inductor 1081 is used as a plate of the MIM capacitor 1082.

FIGS. 11A-11G are another exemplar first circuits of the semiconductor device in accordance with some embodiments. As shown in FIGS. 6A and 11A-11G, the first circuit may refer to a noise absorber 610 to deal with noise generated by some noisy circuits 606 through a seal ring 602. The noise absorber 610 is a transmission line 1104. One end of the transmission line 1104 is connected to the seal ring 602, and another end of the transmission line 1104 is open. The length of the transmission line 1104 is a quarter wavelength long, or an odd multiple of the quarter wavelength long. The wavelength corresponds to a noise to be absorbed.

The length of the transmission line 1104 is formulated as:

$$l = \frac{(2n-1)/\lambda_{\omega 0}}{4},$$

wherein
l: Length of transmission line
$\lambda_{\omega 0}$: Wave length at specefic frequency ω0
$Z_0$: Transmission line impedance
n=1, 2, 3 . . . .

As shown in FIGS. 11A-11G, a substrate 1102 is provided. A noise absorber 1104 may be provided over the substrate 1102 with a single line in FIGS. 11A, 11C, 11E-11G, or a meander shape in FIGS. 11B, 11D. A ground 1106 may be provided under the substrate 1102 in FIGS. 11A, 11B. The ground 1106 may be provided on the top surface and the bottom surface of the substrate 1102 in FIGS. 11C, 11D. The ground 1106 may be provided over the substrate 1102 with line shapes in FIGS. 11E, 11F. The ground 1106 may be provided over the substrate 1102 with line shapes, and also under the substrate 1102 in FIG. 11G.

According to an exemplary embodiment, a semiconductor device is provided. The semiconductor device includes a first seal ring and a first circuit. The first circuit includes a first capacitor and a first inductor connected in series. The first circuit is connected between the first seal ring and a ground.

According to an exemplary embodiment, a semiconductor device is provided. The semiconductor device includes a main circuit, a first seal ring and a first circuit. The main circuit is disposed inside the first seal ring. The first circuit includes a first capacitor and a first inductor connected in series. The first circuit is connected between the first seal ring and a ground.

According to an exemplary embodiment, a method for fabricating a semiconductor device is provided. The method includes the following operations: providing a first seal ring; providing a main circuit inside the first seal ring; and providing a first circuit comprising a first capacitor and a first inductor connected in series, wherein the first circuit is connected between the first seal ring and a ground.

According to an exemplary embodiment, a semiconductor device is provided. The semiconductor device includes a seal ring and a first circuit. The first circuit comprises a transmission line, wherein one end of the transmission line is connected to the seal ring, and another end of the transmission line is open, wherein the length of the transmission line is a quarter wavelength long, or an odd multiple of the quarter wavelength long, wherein the wavelength corresponds to a noise to be absorbed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a main circuit that includes a source of noise;
an assembly isolation region that surrounds the main circuit;
a noise-absorbing circuit that includes a capacitor and an inductor that are (i) connected in series and (ii) selected based on a frequency band of the noise; and
a seal ring that surrounds the assembly isolation region and to which the noise-absorbing circuit is connected.

2. The semiconductor device of claim 1, wherein the assembly isolation region is a substantially rectangular area that surrounds the main circuit.

3. The semiconductor device of claim 1, wherein the noise-absorbing circuit is in the assembly isolation region.

4. The semiconductor device of claim 1, wherein the capacitor and the inductor are located laterally between the seal ring and the main circuit.

5. The semiconductor device of claim 1, wherein the capacitor is connected between the inductor and the seal ring.

6. The semiconductor device of claim 1, wherein the inductor is connected between the capacitor and the seal ring.

7. The semiconductor device of claim 1, wherein the capacitor is a metal-insulator-metal (MIM) capacitor.

8. The semiconductor device of claim 1, wherein the capacitor is a metal-oxide-metal (MOM) capacitor.

9. The semiconductor device of claim 1, wherein the seal ring is an inner seal ring, and the semiconductor device further comprises an outer seal ring that surrounds the inner seal ring.

10. The semiconductor device of claim 1, wherein the inductor comprises one plate of the capacitor.

11. The semiconductor device of claim 1, wherein the inductor is a spiral inductor.

12. The semiconductor device of claim 1, wherein the inductor is a meander inductor.

13. The semiconductor device of claim 1, wherein the inductor is a helical inductor.

14. The semiconductor device of claim 1, wherein the seal ring is continuous.

15. The semiconductor device of claim 1, wherein the capacitor and the inductor are connected in series from the seal ring to a ground.

16. A semiconductor device comprising:
   a main circuit that includes a source of noise;
   an assembly isolation region that surrounds the main circuit;
   a noise-absorbing circuit that is (i) located in the assembly isolation region and (ii) includes a capacitor and an inductor that are connected in series; and
   a seal ring that surrounds the assembly isolation region and to which the noise-absorbing circuit is connected.

17. The semiconductor device of claim 16, wherein the capacitor and inductor are selected based on a frequency band of the noise.

18. The semiconductor device of claim 16, wherein the capacitor and the inductor are connected in series from the first seal ring to a ground.

19. A semiconductor device comprising:
   a main circuit that includes a source of noise;
   a noise-absorbing circuit that includes a capacitor and an inductor that are (i) spaced laterally from the main circuit, (ii) connected in series, and (ii) selected based on a frequency band of the noise; and
   a seal ring that surrounds the main circuit and the noise-absorbing circuit and to which the noise-absorbing circuit is connected.

20. The semiconductor device of claim 16, wherein the capacitor and the inductor are connected in series from the seal ring to a ground.

* * * * *